(12) United States Patent
Pasqualini

(10) Patent No.: US 7,260,808 B1
(45) Date of Patent: Aug. 21, 2007

(54) METHOD AND METRIC FOR LOW POWER STANDARD CELL LOGIC SYNTHESIS

(75) Inventor: Ronald Pasqualini, Los Altos, CA (US)

(73) Assignee: National Semiconductor Corporation, Santa Clara, CA (US)

(*) Notice: Subject to any disclaimer, the term of this patent is extended or adjusted under 35 U.S.C. 154(b) by 227 days.

(21) Appl. No.: 11/009,488

(22) Filed: Dec. 11, 2004

(51) Int. Cl.
*G06F 17/50* (2006.01)

(52) U.S. Cl. .......................................... 716/18; 716/2

(58) Field of Classification Search ................ 716/2, 716/18
See application file for complete search history.

(56) References Cited

U.S. PATENT DOCUMENTS

| 6,567,971 | B1* | 5/2003 | Banzhaf et al. ............... 716/18 |
| 6,609,244 | B2* | 8/2003 | Kato et al. .................... 716/18 |
| 2002/0069396 | A1* | 6/2002 | Bhattacharya et al. ......... 716/7 |
| 2004/0186703 | A1* | 9/2004 | Radjassamy ................. 703/18 |
| 2004/0210857 | A1* | 10/2004 | Srinivasan ..................... 716/2 |

* cited by examiner

*Primary Examiner*—Jack Chiang
(74) *Attorney, Agent, or Firm*—Mark C. Pickering

(57) ABSTRACT

Pseudo area values, which represent standard cell power dissipation, are substituted for physical standard cell areas in a standard cell library. As a result, when a logic synthesizer synthesizes a gate level netlist from hardware description language (HDL) code, the synthesized netlist will describe a logic block that has minimal power dissipation.

20 Claims, 6 Drawing Sheets

---

300

310

CHOOSING A NUMBER OF STANDARD CELL TYPES AND STANDARD CELL DRIVE STRENGTHS FROM A STANDARD CELL LIBRARY OR A GROUP OF STANDARD CELL LIBRARIES. THE CHOSEN STANDARD CELL TYPES AND STANDARD CELL DRIVE STRENGTHS MUST SATISFY THE LOGIC REQUIREMENTS AND TIMING CONSTRAINTS FOR THE LOGIC BLOCK BEING SYNTHESIZED. THE LOGIC REQUIREMENTS AND TIMING CONSTRAINTS ARE DESCRIBED IN HDL (HARDWARE DESCRIPTION LANGUAGE) CODE.

312

CHOOSING STANDARD CELL TYPES AND STANDARD CELL DRIVE STRENGTHS THAT MINIMIZE THE TOTAL POWER DISSIPATED BY THE SYNTHESIZED LOGIC BLOCK. THIS IS ACCOMPLISHED BY MINIMIZING THE TOTAL "PSEUDO AREA" FOR THE SYNTHESIZED LOGIC BLOCK. THE TOTAL PSEUDO AREA ACTUALLY REPRESENTS THE AVERAGE POWER DISSIPATION FOR ALL OF THE GATES AND FLIPFLOPS INSIDE THE SYNTHESIZED LOGIC BLOCK.

314

CALCULATING THE AVERAGE TOTAL CURRENT AND AVERAGE TOTAL POWER DISSIPATION FOR ALL OF THE LOGIC GATES AND FLIPFLOPS THAT ARE CONTAINED IN THE SYNTHESIZED NET LIST.

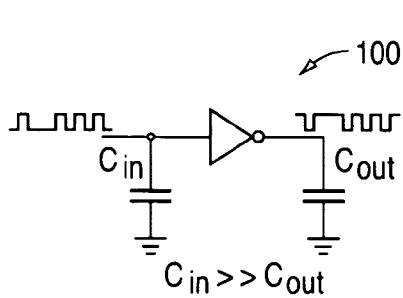
FIG. 1A
(PRIOR ART)
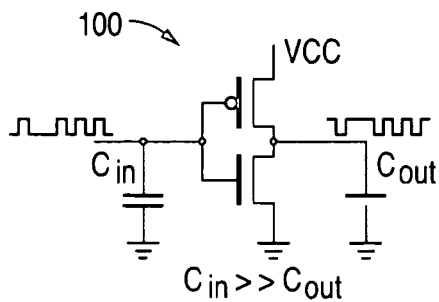
FIG. 1B
(PRIOR ART)
FIG. 2A
(PRIOR ART)
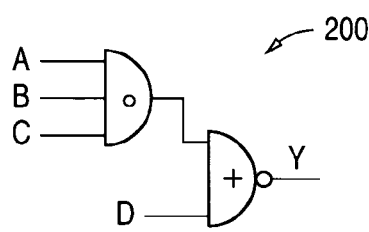
FIG. 2B
(PRIOR ART)
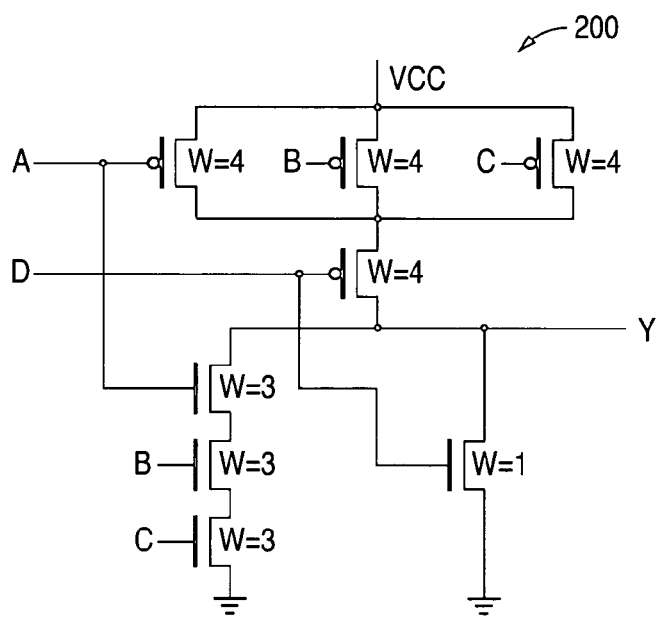
FIG. 4
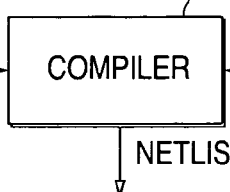
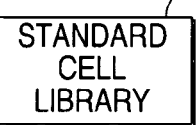

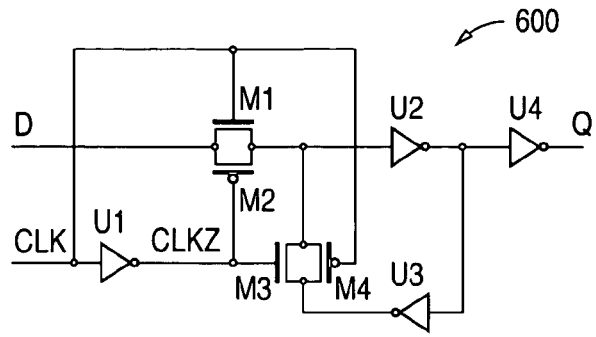

FIG. 6
(PRIOR ART)

FLIPFLOPS

| Item | CellName | Total Data Path Gate Cap Per Flop At Typ Process (pf) | Total Clock Path Gate Cap Per Flop At Typ Process (pf) | # Of Outputs | Cell Count | Data Path Switching Freq (Mhz) | Clock Path Switching Freq (Mhz) |
|---|---|---|---|---|---|---|---|
| 1 | DFF_QQZ_X16 | 0.12790 | 0.00660 | 2 | 150 | 13.90 | 125.000 |
| 2 | DFF_QQZ_X1 | 0.01110 | 0.00476 | 2 | 2,404 | 13.90 | 125.000 |
| 3 | DFF_QQZ_X2 | 0.01761 | 0.00476 | 2 | 128 | 13.90 | 125.000 |
| 4 | DFF_QQZ_X4 | 0.03402 | 0.00476 | 2 | 2 | 13.90 | 125.000 |
| 5 | DFF_QQZ_X8 | 0.06640 | 0.00537 | 2 | 18 | 13.90 | 125.000 |
| 6 | DFF_QZ_CLR_X1 | 0.00857 | 0.00476 | 1 | 35,968 | 13.90 | 125.000 |
| 7 | DFF_QZ_CLR_X2 | 0.01182 | 0.00476 | 1 | 3,404 | 13.90 | 125.000 |
| 8 | DFF_QZ_CLR_X4 | 0.02003 | 0.00476 | 1 | 182 | 13.90 | 125.000 |
| 9 | DFF_QZ_CLR_X8 | 0.03459 | 0.00476 | 1 | 8 | 13.90 | 125.000 |
| 10 | DFF_QZ_SETZ_X1 | 0.00805 | 0.00476 | 1 | 918 | 13.90 | 125.000 |
| 11 | DFF_QZ_SETZ_X2 | 0.01131 | 0.00476 | 1 | 76 | 13.90 | 125.000 |
| 12 | DFF_QZ_SETZ_X4 | 0.01951 | 0.00476 | 1 | 2 | 13.90 | 125.000 |
| 13 | DFF_QZ_X16 | 0.06793 | 0.00476 | 1 | 28 | 13.90 | 125.000 |
| 14 | DFF_QZ_X1 | 0.00791 | 0.00476 | 1 | 1,284 | 13.90 | 125.000 |
| 15 | DFF_QZ_X2 | 0.01116 | 0.00476 | 1 | 62 | 13.90 | 125.000 |
| 16 | DFF_QZ_X4 | 0.01937 | 0.00476 | 1 | 24 | 13.90 | 125.000 |
| 17 | DFF_QZ_X8 | 0.03393 | 0.00476 | 1 | 250 | 13.90 | 125.000 |
| 18 | DFF_Q_X16 | 0.06446 | 0.00537 | 1 | 80 | 13.90 | 125.000 |
| 19 | DFF_Q_X1 | 0.00791 | 0.00476 | 1 | 9,192 | 13.90 | 125.000 |
| 20 | DFF_Q_X2 | 0.01116 | 0.00476 | 1 | 1,674 | 13.90 | 125.000 |
| 21 | DFF_Q_X4 | 0.01937 | 0.00476 | 1 | 760 | 13.90 | 125.000 |
| 22 | DFF_Q_X8 | 0.03393 | 0.00476 | 1 | 48 | 13.90 | 125.000 |
| | | | | | 56,662 | | |

FIG. 8A

| Parameter Description | Parameter Name | Parameter Value | Parameter Units |
|---|---|---|---|
| VCC | VCC | 1.98 | V |
| Average clock frequency for flipflops | CLK_FREQ | 125 | Mhz |
| Average data frequency for flipflops & logic gates | DTA_FREQ | 13.9 | Mhz |
| Process (slo,typ,fast) | PROCESS | typ | - |
| Interlayer dielectric (thin,typ,thick) | ILD | typ | - |
| Average wire capacitance at outputs of gates & flipflops | AVG_WCAP | 16.300 | ff |
| Gate capacitance per sq micron at TYP process | TYP_GATE_CAP | 8.8540 | ff/sq mic |
| Gate capacitance thickness factor | GC_TF | 1.000 | - |
| Interlayer dielectric thickness factor | ILD_TF | 1.000 | - |

LOGIC GATES (non-flipflops)

| Item | CellName | Avg Gate Input Cap @ TYP Proc (pf) | # Of Inputs Per Cell | # Of Outputs Per Cell | Cell Count | Total Gate Input Cap @ Spec Proc (pf) | Switching Freq (Mhz) |
|---|---|---|---|---|---|---|---|
| 1 | AND2D1X12 | 0.012000 | 2 | 1 | 46 | 1.162 | 13.90 |
| 2 | AND2D1X16 | 0.014000 | 2 | 1 | 12 | 0.354 | 13.90 |
| 3 | AND2D1X2 | 0.006500 | 2 | 1 | 24 | 0.328 | 13.90 |
| 4 | AND2D1X4 | 0.006500 | 2 | 1 | 8 | 0.109 | 13.90 |
| 5 | AND2D1X8 | 0.008500 | 2 | 1 | 42 | 0.752 | 13.90 |
| 6 | AND2X12 | 0.017000 | 2 | 1 | 298 | 10.665 | 13.90 |
| 7 | AND2X16 | 0.022000 | 2 | 1 | 148 | 6.855 | 13.90 |
| 8 | AND2X1 | 0.007000 | 2 | 1 | 1,734 | 25.554 | 13.90 |
| 9 | AND2X2 | 0.007000 | 2 | 1 | 448 | 6.602 | 13.90 |
| 10 | AND2X4 | 0.007000 | 2 | 1 | 128 | 1.886 | 13.90 |
| 11 | AND2X8 | 0.011500 | 2 | 1 | 328 | 7.941 | 13.90 |
| 12 | AND3D1X1 | 0.007333 | 3 | 1 | 4 | 0.093 | 13.90 |
| 215 | XNOR2X1 | 0.013500 | 2 | 1 | 12,962 | 368.394 | 13.90 |
| 216 | XNOR2X2 | 0.021000 | 2 | 1 | 9,912 | 438.215 | 13.90 |
| 217 | XNOR2X4 | 0.035000 | 2 | 1 | 780 | 57.474 | 13.90 |
| 218 | XNOR2X8 | 0.068000 | 2 | 1 | 658 | 94.198 | 13.90 |
| 219 | XOR2AX1 | 0.018500 | 2 | 1 | 754 | 29.366 | 13.90 |
| 220 | XOR2AX2 | 0.028500 | 2 | 1 | 178 | 10.680 | 13.90 |
| 221 | XOR2X1 | 0.014000 | 2 | 1 | 3,274 | 96.497 | 13.90 |
| 222 | XOR2X2 | 0.020500 | 2 | 1 | 1,010 | 43.589 | 13.90 |
| 223 | XOR2X8 | 0.064500 | 2 | 1 | 44 | 5.975 | 13.90 |
| 224 | XOR3X1 | 0.013333 | 3 | 1 | 1,508 | 63.495 | 13.90 |
| 225 | XOR3X2 | 0.015667 | 3 | 1 | 90 | 4.453 | 13.90 |
| 226 | XOR3X8 | 0.038667 | 3 | 1 | 8 | 0.977 | 13.90 |
| | | | | | 455,264 | 13,249 | |

| Total Current Due To Gate Cap @ Spec Proc (ma) | Total Current Due To Wire Cap @ Spec ILD (ma) | Total Current Due To Gate Cap And Wire Cap @ Spec Proc & Spec ILD (ma) | Total Power Due To Gate Cap @ Spec Proc (mw) | Total Power Due To Wire Cap @ Spec ILD (mw) | Total Power Due To Wire Cap And Gate Cap @ Spec Proc & Spec ILD (mw) |
|---|---|---|---|---|---|
| 0.032 | 0.021 | 0.053 | 0.063 | 0.041 | 0.104 |
| 0.010 | 0.005 | 0.015 | 0.019 | 0.011 | 0.030 |
| 0.009 | 0.011 | 0.020 | 0.018 | 0.021 | 0.039 |
| 0.003 | 0.004 | 0.007 | 0.006 | 0.007 | 0.013 |
| 0.021 | 0.019 | 0.040 | 0.041 | 0.037 | 0.078 |
| 0.294 | 0.134 | 0.427 | 0.581 | 0.265 | 0.846 |
| 0.189 | 0.066 | 0.255 | 0.374 | 0.131 | 0.505 |
| 0.703 | 0.778 | 1.481 | 1.393 | 1.540 | 2.933 |
| 0.182 | 0.201 | 0.383 | 0.360 | 0.398 | 0.758 |
| 0.052 | 0.057 | 0.109 | 0.103 | 0.114 | 0.216 |
| 0.219 | 0.147 | 0.366 | 0.433 | 0.291 | 0.724 |
| 0.003 | 0.002 | 0.004 | 0.005 | 0.004 | 0.009 |
| | | | | | |
| 10.139 | 5.815 | 15.954 | 20.075 | 11.513 | 31.589 |
| 12.061 | 4.447 | 16.507 | 23.880 | 8.804 | 32.684 |
| 1.582 | 0.350 | 1.932 | 3.132 | 0.693 | 3.825 |
| 2.593 | 0.295 | 2.888 | 5.133 | 0.584 | 5.718 |
| 0.808 | 0.338 | 1.146 | 1.600 | 0.670 | 2.270 |
| 0.294 | 0.080 | 0.374 | 0.582 | 0.158 | 0.740 |
| 2.656 | 1.469 | 4.125 | 5.258 | 2.908 | 8.167 |
| 1.200 | 0.453 | 1.653 | 2.375 | 0.897 | 3.272 |
| 0.164 | 0.020 | 0.184 | 0.326 | 0.039 | 0.365 |
| 1.748 | 0.677 | 2.424 | 3.460 | 1.339 | 4.800 |
| 0.123 | 0.040 | 0.163 | 0.243 | 0.080 | 0.323 |
| 0.027 | 0.004 | 0.030 | 0.053 | 0.007 | 0.060 |
| 364.649 | 212.620 | 577.269 | 722.005 | 420.987 | 1,142.993 |

FIG. 7B

| Total Current Due To Data Path Gate Cap @ Spec Proc (ma) | Total Current Due To Clock Path Gate Cap @ Spec Proc (ma) | Total Current Due To Wire Cap @ Spec ILD (ma) | Total Current Due To Data Path, Clock Path & Wire Cap @ Spec ILD & Spec Proc (ma) | Total Power Due To Data Path @ Spec Proc (mw) | Total Power Due To Clock Path @ Spec Proc (mw) | Total Power Due To Wire Cap @ Spec ILD (mw) | Total Power Due To Data Path, Clock Path & Wire Cap @ Spec ILD & Spec Proc (mw) |
|---|---|---|---|---|---|---|---|
| 0.556 | 0.258 | 0.135 | 0.948 | 1.101 | 0.510 | 0.266 | 1.877 |
| 0.773 | 2.983 | 2.157 | 5.913 | 1.531 | 5.906 | 4.271 | 11.708 |
| 0.065 | 0.159 | 0.115 | 0.339 | 0.129 | 0.314 | 0.227 | 0.671 |
| 0.002 | 0.002 | 0.002 | 0.006 | 0.004 | 0.005 | 0.004 | 0.012 |
| 0.035 | 0.025 | 0.016 | 0.076 | 0.069 | 0.050 | 0.032 | 0.150 |
| 8.932 | 44.629 | 16.136 | 69.697 | 17.686 | 88.366 | 31.948 | 138.000 |
| 1.166 | 4.224 | 1.527 | 6.917 | 2.309 | 8.363 | 3.024 | 13.695 |
| 0.106 | 0.226 | 0.082 | 0.413 | 0.209 | 0.447 | 0.162 | 0.818 |
| 0.008 | 0.010 | 0.004 | 0.022 | 0.016 | 0.020 | 0.007 | 0.043 |
| 0.214 | 1.139 | 0.412 | 1.765 | 0.424 | 2.255 | 0.815 | 3.495 |
| 0.025 | 0.094 | 0.034 | 0.153 | 0.049 | 0.187 | 0.068 | 0.304 |
| 0.001 | 0.002 | 0.001 | 0.005 | 0.002 | 0.005 | 0.002 | 0.009 |
| 0.055 | 0.035 | 0.013 | 0.102 | 0.109 | 0.069 | 0.025 | 0.203 |
| 0.294 | 1.593 | 0.576 | 2.463 | 0.582 | 3.155 | 1.141 | 4.877 |
| 0.020 | 0.077 | 0.028 | 0.125 | 0.040 | 0.152 | 0.055 | 0.247 |
| 0.013 | 0.030 | 0.011 | 0.054 | 0.027 | 0.059 | 0.021 | 0.107 |
| 0.246 | 0.310 | 0.112 | 0.668 | 0.487 | 0.614 | 0.222 | 1.323 |
| 0.149 | 0.112 | 0.036 | 0.297 | 0.296 | 0.222 | 0.071 | 0.589 |
| 2.106 | 11.405 | 4.124 | 17.635 | 4.169 | 22.583 | 8.165 | 34.916 |
| 0.541 | 2.077 | 0.751 | 3.369 | 1.072 | 4.113 | 1.487 | 6.671 |
| 0.426 | 0.943 | 0.341 | 1.710 | 0.844 | 1.867 | 0.675 | 3.386 |
| 0.047 | 0.060 | 0.022 | 0.128 | 0.093 | 0.118 | 0.043 | 0.254 |
| 15.781 | 70.393 | 26.631 | 112.806 | 31.247 | 139.379 | 52.730 | 223.355 |

FIG. 8B

METHOD AND METRIC FOR LOW POWER STANDARD CELL LOGIC SYNTHESIS

BACKGROUND OF THE INVENTION

1. Field of the Invention

The present invention relates to logic synthesis and, more particularly, to a method and metric for low power logic synthesis using standard cells.

2. Description of the Related Art

The number of standard cells that are present on current-generation CMOS chips number well into the millions. As CMOS design rules continue to shrink, the number of on-chip standard cells will continue to increase. At the present time, the largest CMOS chips contain over 10 million cells. With next-generation chips, it is a virtual certainty that the number of on-chip standard cells will exceed 100 million.

Even though CMOS device scaling and VCC scaling are decreasing the average power dissipation per standard cell, the sharp increase in the total number of on-chip standard cells is causing total on-chip power dissipation to drastically increase. This large power increase is rapidly becoming the limiting factor in determining the maximum amount of logic functionality that can be put onto a single CMOS chip. Thus, in order to build more complex CMOS chips, the total power dissipation, due to all of the on-chip standard cells, must be reduced to an absolute minimum.

Most of today's complex CMOS chips are designed by writing high level code in a hardware description language, such as Verilog™ or VHDL. This high level code is then parsed and broken down into logic gates (standard cells) by a logic synthesis tool, such the Design Compiler™ available from Synopsys® Incorporated.

The standard cell netlists produced by all synthesis tools must meet three strict criteria: (1) the netlists must produce the desired logic behavior, (2) the netlists must meet all of the system timing requirements, and (3) the netlists must contain minimal standard cell area. The system timing requirements include set up and hold time for flipflops and latches, and chip input-to-output delays.

It is important to note that the above synthesis criteria attempt to minimize total standard cell area, not total standard cell power dissipation. In other words, most logic synthesis tools try to minimize total standard cell area while simultaneously providing adequate positive timing slack for all signal paths. Thus, when the area cost is low, logic synthesis tools have a built-in propensity to choose faster cells, increasing power dissipation.

For example, many standard cell libraries contain low drive strength cells (such as X1/X2 strength inverters) that occupy the same chip area. Thus, if two cells occupy the same chip area and one of them offers less delay, the logic synthesis tool will always choose the faster cell, even though the smaller delay may not be needed. This results in higher power dissipation because faster cells contain larger transistors that dissipate more power.

In light of the limitations described above, there is a definite need for a synthesis metric and a synthesis method that minimize total standard cell power dissipation, instead of total standard cell area. Furthermore, although this synthesis metric and synthesis method need not produce absolute minimum standard cell area, they must nevertheless produce reasonably small standard cell area.

Except for DC leakage current, standard CMOS logic gates do not dissipate any DC power. Hence the average power dissipation of standard CMOS logic gates is due to their AC switching activity only. Therefore, in order to minimize standard cell power dissipation, the average power dissipated by a standard CMOS logic gate must be quantified, as described in detail below.

FIGS. 1A and 1B show equivalent logic/circuit diagrams that illustrate a prior-art logic gate, inverter 100. As shown in FIGS. 1A and 1B, inverter 100 has a single logic gate input and a single logic gate output. The logic gate input has an associated logic gate input capacitance $C_{IN}$, and the logic gate output has an associated logic gate output capacitance $C_{OUT}$.

Referring to FIGS. 1A and 1B, the logic gate input capacitance $C_{IN}$ is mostly due to the gate oxide capacitances of the transistors connected to the logic gate input(s). In other words, since logic gates have physically small dimensions, their internal parasitic capacitances are very small in comparison to their internal transistor gate oxide capacitances.

The logic gate output capacitance $C_{OUT}$ only includes the internal parasitic capacitances present at the logic gate output node. In other words, the logic gate output capacitance $C_{OUT}$ does not include the fanout capacitance that is being driven. (The fanout capacitance includes the capacitances associated with the logic gate inputs that are being driven, plus the capacitances of the interconnect wires that are being driven).

As shown in FIGS. 1A and 1B, for most logic gates, $C_{IN}$ is much larger than $C_{OUT}$. Hence, for power computation purposes, the logic gate output capacitance $C_{OUT}$ can usually be ignored. Thus the AC power dissipation of inverter 100, which is an example of a simple CMOS logic gate, can be calculated from equation EQ.1 as follows:

$$\text{Average } AC \text{ power} = C_{IN} * VCC^2 * F_{AVG} \qquad \text{EQ.1}$$

where $C_{IN}$ is the logic gate input capacitance of inverter 100, VCC is the power supply voltage, and $F_{AVG}$ is the average switching frequency.

Referring to EQ. 1, all logic synthesis tools are cognizant of the $C_{IN}$ value at each input of each standard cell. Furthermore, these synthesis tools are also cognizant of the global VCC value. Nevertheless, these synthesis tools are still unable to accurately calculate and minimize total standard cell power dissipation because: (1) the tools do not account for power dissipation due to the parasitic gate capacitances of internal transistors that are not directly connected to the logic gate inputs, and (2) the tools are unaware of the value of $F_{AVG}$, which depends upon input vectors (waveforms) that are unspecified during logic synthesis. (As described below, $F_{AVG}$ actually has two components, one for clock paths and one for data paths.)

For example, all flipflops contain internal transistors whose gate capacitance values are ignored during logic synthesis. Furthermore, all flipflops contain two paths: a clock path and a data path. Although the clock frequency is known during logic synthesis, the total internal clock capacitance is unknown (ignored), and the total internal data path capacitance is also unknown (ignored). In addition, the average data path frequency is unknown (ignored) because it depends upon input vectors (waveforms) that are unspecified during logic synthesis.

Another complication stems from the fact that the power dissipation of a CMOS logic gate depends upon its input capacitance, which can be different for each input pin on a given logic gate.

FIGS. 2A and 2B show equivalent logic/circuit circuit diagrams that illustrate a prior-art complex logic gate 200. Complex logic gate 200 is an and-or-invert (AOI) logic gate.

As shown in FIG. 2B, the input capacitance on pin A is greater than the input capacitance on pin D because pin A has an equivalent device width of seven (4+3), whereas pin D only has an equivalent device width of five (4+1). This equivalent device width difference occurs due to the required differences in device sizing due to differences in device stacking. Thus, even if the same voltage waveform were applied to both pins, the power dissipation on pin A would be greater than the power dissipation on pin D, because pin A has a higher capacitance than pin D.

In summary, present-day logic synthesis tools do not do a good job of minimizing total standard cell power because the tools are not cognizant of the key parameters that affect standard cell power, and the tools also lack a suitable metric that would allow them to minimize total standard cell power.

When it comes to minimizing total standard cell area, most logic synthesis tools are highly efficient. In other words, when total standard cell area is chosen as the metric to be minimized, these tools do an excellent job. However, with regard to minimizing total standard cell power, most synthesis tools only allow the user to indirectly minimize power. This is usually done by employing techniques such as: (A) clock gating, (B) halting switching activity in logic blocks when the blocks are not being used, and (C) using power down signals or "sleep" signals to decrease switching activity in different modes of operation.

Furthermore, CMOS chip designers and CMOS process engineers have also employed a variety of physical design techniques to minimize power, including: (A) scaling the process design rules, (B) reducing the power supply voltage, (C) using more efficient (lower capacitance) routing, (D) reducing the transistor count, and (E) reducing the transistor sizes. Present day power reduction techniques also include: (F) increasing the number of available drive strengths, (G) reducing the flow-thru current (crowbar current), (H) reducing the average timing slack, (I) creating customized cell instances, (J) using high $V_T$ cells to reduce DC leakage current, and (K) using multiple VCC voltage levels.

Although the above physical techniques can be highly effective, they still do not allow the user to directly minimize total standard cell power dissipation during logic synthesis. Thus, as stated above, there is a definite need for a logic synthesis metric and a logic synthesis method that minimize total standard cell power dissipation, while simultaneously producing reasonably small standard cell area.

BRIEF DESCRIPTION OF THE DRAWINGS

FIGS. 1A and 1B are equivalent logic/circuit diagrams illustrating a prior-art inverter 100.

FIGS. 2A and 2B are equivalent logic/circuit diagrams illustrating a prior-art complex gate 200.

FIG. 4 is a block diagram illustrating an example of a synthesis system 400 in accordance with the present invention.

FIG. 6 is an electrical schematic illustrating a prior-art CMOS D latch 600.

FIGS. 7A–7B are layouts illustrating an example of a spreadsheet 700 in accordance with the present invention.

FIGS. 8A–8B are layouts illustrating an example of a spreadsheet 800 in accordance with the present invention.

DETAILED DESCRIPTION OF THE INVENTION

Figure 3:
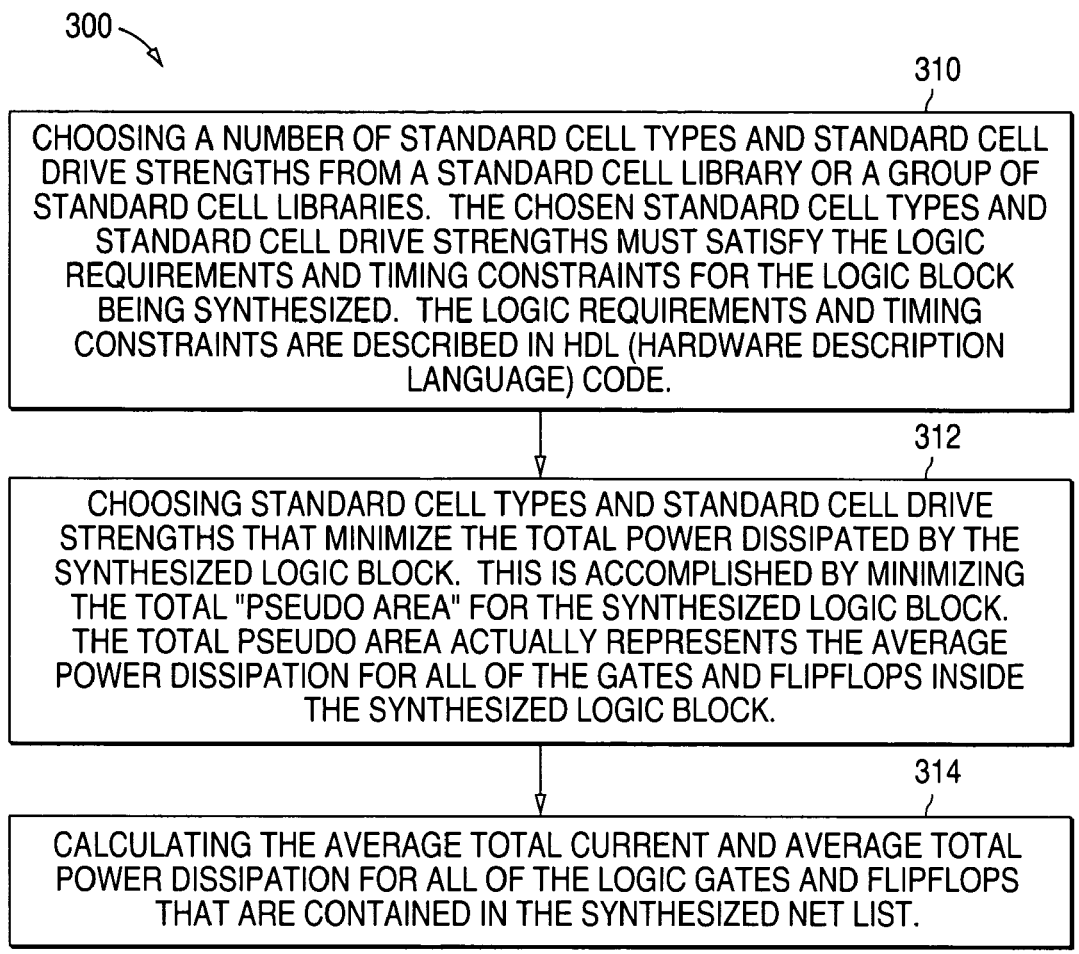
FIG. 3 is a flow chart illustrating an example of a method 300 to perform low power logic synthesis in accordance with the present invention.

In accordance with the present invention, FIG. 3 shows a flow chart that illustrates an example of a method 300 for synthesizing a logic block that is specified in HDL (hardware description language) code. The logic synthesis procedure consists of choosing standard cells from a standard cell library or a group of standard cell libraries. As described in greater detail below, standard cell "pseudo area" values, which actually represent standard cell power consumptions, are substituted for physical standard cell area values in order to generate a synthesized logic block that has minimal average power dissipation.

As shown in FIG. 3, method 300 begins at step 310 by identifying standard cell types and standard cell drive strengths that satisfy the logic requirements and timing constraints of the block to be synthesized. These logic requirements and timing constraints can be described in hardware description language (HDL) code, such as Verilog™ or VHDL available from Synopsys® Incorporated.

The steps required to generate HDL code are well known in the art. For example, a logic block can be described using behavioral language coding, register transfer level coding or component instantiation coding. In addition, the steps required to interpret HDL coding, in order to generate a gate level netlist, are also well known in the art.

As shown in FIG. 3, steps 310 and 312 of method 300 generate a list of standard cells (i.e. a netlist) for the block being synthesized. The standard cell netlist is generated by selecting standard cell types and standard cell drive strengths from one or more standard cell libraries. Each standard cell is chosen based upon one or more of its characteristics, such as its timing characteristics and its surface area characteristic. The surface area characteristic represents the amount of chip surface area consumed by the standard cell, while the timing characteristics represent the timing delays from a standard cell's input pin(s) to its output pin(s).

In accordance with the present invention, step 312 of method 300 selects the standard cell types and standard cell drive strengths that result in minimal power dissipation for the logic block. In further accordance with the present invention, the value associated with the surface area characteristic of each standard cell is not the true physical surface area. Instead, the physical surface area is replaced by a "pseudo area" value that represents the amount of power dissipated by each standard cell.

FIG. 4 shows a block diagram that illustrates an example of a synthesis system 400 in accordance with the present invention. As shown in FIG. 4, system 400 includes an HDL compiler 410 and one or more standard cell libraries 412 that are accessible to HDL compiler 410. For example, HDL compiler 410 can be implemented with the Design Compiler™ available from Synopsys® Incorporated.

In operation, compiler 410 receives behavioral HDL code that describes the logic requirements of the block to be synthesized. Compiler 410 then parses the HDL code and generates a gate level netlist by accessing one or more standard cell libraries 412. The standard cell libraries are accessed in order to obtain the characteristics associated with each standard cell.

In accordance with the present invention, the standard cell libraries 412 are modified (rewritten) so that they contain a pseudo area for standard each cell, rather than the actual physical surface area for each standard cell. However, as noted above, the standard cell pseudo areas are actually power dissipation values, not physical cell areas. As described in greater detail below, the standard cell pseudo areas can be absolute power dissipation values or relative power dissipation values.

Pseudo areas depend upon the total gate oxide capacitance associated with each standard cell. The total gate oxide capacitance is the sum of the gate oxide capacitances of all transistors in the cell, including input transistors and internal transistors (if present). As described in greater detail below, the pseudo areas for standard cells that contain memory, such as flipflops and latches, are calculated differently than the pseudo areas of non-memory standard cells, such as logic gates.

The total gate oxide capacitance for each non-memory standard cell depends upon its total gate oxide area and its total gate oxide periphery. However, it should be noted that the transistors inside of most non-memory standard cells usually have identical (i.e. minimum) channel lengths. As a consequence of this, the total real-world gate oxide area and the total real-world gate oxide periphery, for all of the transistors inside of a non-memory standard cell, can be computed from EQS. 2 and 3 below:

$$RWA = (PSF)\sum_{i=1}^{N} W_i * (PSF*L - CLOC) \quad \text{EQ. 2}$$

$$RWP = (PSF)\sum_{i=1}^{N} W_i + 2*N*(PSF*L - CLOC) \quad \text{EQ. 3}$$

where RWA is the real world area of all transistors inside the cell, RWP is the real world periphery of all transistors inside the cell, PSF is the process scale factor (PSF=1.0 for no process scaling), and N is the total number of transistors inside the cell, including multiple transistor fingers. $W_i$ is the drawn width of transistor i or transistor finger i, L is the drawn length of each transistor in the cell, and CLOC is the transistor channel length offset constant (CLOC=0 for no offset).

Using the RWA and RWP values from EQS. 2 and 3 above, the total gate oxide capacitance for all transistors in a standard cell can be computed from EQ. 4 below:

$$GOC=RWA*Ca+RWP*(Cf+Cc) \quad \text{EQ. 4}$$

where GOC is the total gate oxide capacitance of all transistors inside the standard cell, Ca is the gate oxide area capacitance constant, Cf is the gate oxide fringe capacitance constant, and Cc is the gate oxide coupling capacitance constant.

If standard cell layouts are available, the gate oxide capacitances can be directly extracted from the standard cell layouts, instead of being calculated from EQS. 2–4 above. For example, the gate oxide capacitances can be extracted by running a parasitic extraction tool.

Furthermore, the internal interconnect capacitances inside of each standard cell can also be extracted. When extracted, these internal interconnect capacitances can be added to the extracted gate oxide capacitances in order to form a total extracted capacitance. This total extracted capacitance can then be used in lieu of the total gate oxide capacitance GOC.

Nevertheless, it should be noted that standard cells are relatively small in size and hence their total internal interconnect capacitance is small in comparison to their total gate oxide capacitance. As a consequence of this, the pseudo area for any given standard cell will be dominated by its total gate oxide capacitance.

As discussed above, the average power dissipation of a standard CMOS logic gate is due to its AC switching activity. Thus, using the GOC value from equation EQ. 4, the total AC power dissipation of a standard cell (i.e. its pseudo area) can be calculated from equation EQ. 5 below:

$$CPA=GOC*VCC^2*F_{AVG} \quad \text{EQ. 5}$$

where CPA is the cell pseudo area (average AC power dissipation of the cell), GOC is the gate oxide capacitance of all transistors inside the cell, VCC is the cell power supply voltage, and $F_{AVG}$ is the average switching frequency of all standard cells.

Referring to EQ. 5, the cell pseudo area (CPA) represents the average AC power dissipation for any given standard cell. Furthermore, by definition, all cells that share the same VCC voltage can be regarded as having the same average switching frequency ($F_{AVG}$). Thus, the relative pseudo area for any two standard cells (which share the same VCC voltage) only depends upon the ratio of their gate oxide capacitance (GOC) values. For example, if a given cell has a GOC value that is 37% higher than another cell, the former cell will also have a cell pseudo area (CPA) value that is 37% higher.

As shown in equation EQ. 5, the cell pseudo area (CPA) for a logic gate depends upon three parameters: gate oxide capacitance (GOC), power supply voltage (VCC), and average switching frequency ($F_{AVG}$). Of these three parameters, VCC is a known value and GOC can be easily obtained as discussed above. Thus, $F_{AVG}$ is the only parameter that must be estimated.

If $F_{AVG}$ is accurately estimated, the pseudo area (CPA) for any given standard cell will accurately reflect the absolute power dissipation of the cell and the relative power dissipation of the cell (i.e. the cell power dissipation relative to other cells). However, if $F_{AVG}$ is not accurately estimated, the cell pseudo area (CPA) for any given cell will not accurately reflect its absolute power dissipation.

Nevertheless, the relative power dissipation of any given cell will still be correctly computed because, as shown in equation EQ. 5, the relative power dissipation only depends upon the total gate oxide capacitance (GOC) of one cell versus another cell. This is extremely important because it insures that the logic synthesis tool will always find a minimal power solution, even when the absolute power dissipation of all of the standard cells is not accurately known.

Minimizing the total cell pseudo area (CPA) not only saves power, it also tends to keep the total standard cell area low during logic synthesis. The reason for this is that minimizing the cell pseudo area (CPA) is equivalent to minimizing the cell gate oxide capacitance (GOC).

Furthermore, minimizing the gate oxide capacitance (GOC) involves utilizing cells that contain fewer transistors and/or smaller transistors, which tends to keep the total standard cell area small. (Of course, in those cases where minimum cell area is required rather than minimum power dissipation, logic synthesis should be performed using physical cell area as the metric to be minimized, not pseudo cell area.)

As previously discussed, EQS. 2–5 can be used to calculate the pseudo area for logic gates (non-memory standard cells). However, in order to calculate the pseudo area for memory standard cells (flip-flops and latches), equations EQ. 2–5 must be slightly modified. The reason for this is that flipflops and latches have two distinct signal paths: a clock path and a data path.

In most systems, the average frequency of the clock path ($F_{CLK}$) is usually much higher than the average frequency of the data path ($F_{DATA}$). Thus, in a typical application, $F_{DATA}$ will only be approximately $\frac{1}{10}^{th}$ of $F_{CLK}$. In order to account for this significant frequency difference, the average clock path pseudo area ($CPA_{CLK}$) must be separately computed from the average data path pseudo area ($CPA_{DATA}$). Thus the total pseudo area of a flipflop or a latch can be obtained by simply adding $CPA_{CLK}$ and $CPA_{DATA}$ together.

In order to calculate the average clock path power ($CPA_{CLK}$), the total gate oxide capacitance of the clock path ($GOC_{CLK}$) must be separately computed. Similarly, in order to calculate the average data path power ($CPA_{DATA}$), the total gate oxide capacitance of the data path ($GOC_{DATA}$) must be separately computed.

Figure 5:
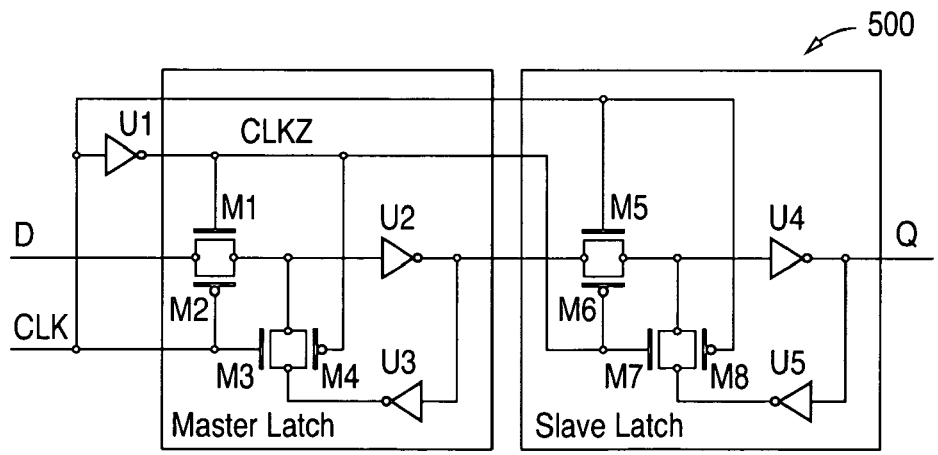
FIG. 5 is an electrical schematic illustrating a prior-art CMOS D flipflop 500.

FIG. 5 shows an electrical schematic that illustrates a prior-art CMOS D flipflop 500. Referring to FIG. 5, the total gate oxide capacitance of the clock path ($GOC_{CLK}$) can be obtained by adding together the gate oxide capacitance of transistors M1–M8, plus the gate oxide capacitance of the two transistors located inside of clock inverter U1. Similarly, the total gate oxide capacitance of the data path ($GOC_{DATA}$) can be obtained by adding together the gate oxide capacitances of inverters U2–U5.

FIG. 6 shows an electrical schematic that illustrates a prior-art CMOS D latch 600. Referring to FIG. 6, the total gate oxide capacitance of the clock path ($GOC_{CLK}$) can be obtained by adding together the gate oxide capacitance of transistors M1–M4, plus the gate oxide capacitance of the two transistors located inside of clock inverter U1. Similarly, the total gate oxide capacitance of the data path ($GOC_{DATA}$) can be obtained by adding together the gate oxide capacitances of inverters U2–U4.

Thus the cell pseudo area $CPA_{CLK}$ can be calculated from equation EQ. 6 below:

$$CPA_{CLK} = GOC_{CLK} * VCC^2 * F_{CLK} \qquad \text{EQ. 6}$$

Furthermore, the cell pseudo area $CPA_{DATA}$ can be calculated from equation EQ. 7 below:

$$CPA_{DATA} = GOC_{DATA} * VCC^2 * F_{DATA}. \qquad \text{EQ. 7}$$

Using EQS. 6 and 7 above, the total cell pseudo area can be obtained by simply summing $CPA_{CLK}$ and $CPA_{DATA}$.

When cell pseudo areas are used to perform logic synthesis, the total standard cell area reported by the synthesis tool, at the completion of logic synthesis, is not equal to the total standard cell physical area. (As described above, the reported area is actually equal to the total standard cell power dissipation). This misreporting of the total physical area is not a problem, however, because the total physical cell area can be easily obtained by simply opening up the synthesized design using a library that contains the actual physical cell areas, not the pseudo areas.

After a logic block has been synthesized using cell pseudo areas, the total power dissipation for the block can be accurately determined by performing a circuit simulation using input vectors. This approach also provides instantaneous power dissipation as well as average power dissipation.

However, for very large chips, performing a gate level circuit simulation might not be feasible because it would take too long. In this case, a spreadsheet can be used to calculate the average total current and the average total power dissipation, for all of the gates and flip-flops in the synthesized netlist.

If a spreadsheet is used, it must contain cell counts for each of the gate types and flipflop types in the netlist, including certain parameter values associated with each gate type and each flipflop type. Furthermore, the spreadsheet must also contain a number of global constants.

As shown in FIG. 3, after step 312 has been performed, method 300 can optionally include step 314. Step 314 is used to determine the average total current and the average total power dissipation, for all of the gates and flipflops in the synthesized block.

In accordance with the present invention, FIGS. 7A and 7B show a layout that illustrates an example of a spreadsheet 700. As shown in FIG. 7A, spreadsheet 700 includes 226 different standard cell types (for clarity, all of the cell types are not shown). Furthermore, as shown in FIG. 7A, spreadsheet 700 also includes 455,264 standard cell instances. Referring to FIG. 7B, these 455,264 standard cell instances have a total power dissipation of 1,142.993 milliwatts.

In order to calculate the power dissipation of the synthesized logic block, spreadsheet 700 requires that the following nine global constants must be specified: (1) VCC power supply voltage, (2) average clock frequency for flipflops, (3) average data frequency for flipflops and logic gates, (4) process corner (slow, typical, or fast), (5) interlayer dielectric (ILD) corner (thin, typical or thick), (6) average wire capacitance at the outputs of gates and flipflops, (7) gate capacitance per square micron at typical process, (8) gate capacitance thickness factor, and (9) interlayer dielectric thickness factor.

As further shown in FIG. 7A, the raw input data for each of the 226 logic cell types includes the following: (1) average gate input capacitance at typical process, (2) number of inputs per cell, (3) number of outputs per cell, and (4) cell count.

Referring to FIGS. 7A and 7B, it can be seen that the following eight parameters can be calculated, in aggregate, for all of the instances of each standard cell type: (1) total gate input capacitance at the specified process corner, (2) cell switching frequency (default value is the average data frequency for flipflops and logic gates), (3) total current due to gate capacitance at the specified process corner, (4) total current due to wire capacitance at the specified by ILD corner, (5) total current due to gate capacitance and wire capacitance at the specified process corner (sum of item 3 plus item 4), (6) total power due to gate capacitance at the specified process corner, (7) total power due to wire capacitance at the specified ILD corner, and (8) total power due to wire capacitance and gate capacitance at the specified process/ILD corners (sum of item 6 plus item 7).

FIGS. 8A and 8B show a layout that illustrates an example of a spreadsheet 800 in accordance with the present invention. As shown in FIGS. 8A and 8B, spreadsheet 800 calculates the power dissipation of the flipflops that are used in conjunction with the standard cell logic gates shown in FIGS. 7A–7B. As a result, spreadsheet 800 utilizes the same nine global parameters shown in FIG. 7A.

Referring to FIG. 8A, it can be seen that the synthesized logic block contains 22 different flipflop types and 56,662 flipflop instances. As shown in FIG. 8B, the total power dissipation for all of the flip-flop instances is 223.335 milliwatts.

Referring to FIG. 8A, the raw input data for each of the 22 flip-flop types includes the following: (1) total data path gate capacitance per flipflop at typical process, (2) total clock path gate capacitance per flipflop at typical process, (3) number of flipflop outputs, and (4) flip-flop cell count.

Again referring to FIGS. 8A and 8B, it can be seen that the following 10 parameters can be calculated, in aggregate, for all of the flipflop instances: (1) data path switching frequency (default value is the average data frequency for flipflops and logic gates), (2) clock path switching frequency (default value is the frequency of the master clock), (3) total current due to data path gate capacitance at the specified process corner, (4) total current due to clock path gate capacitance at the specified process corner, (5) total current due to wire capacitance at the specified ILD corner, (6) total current due to data path capacitance, clock path capacitance and wire capacitance at the specified process/ILD corners (sum of item 3 plus item 4 plus item 5), (7) total power due to data path gate capacitance at the specified process corner, (8) total power due to clock path gate capacitance at the specified process corner, (9) total power due to wire capacitance at the specified ILD corner, and (10) total power due to data path capacitance, clock path capacitance and wire capacitance at the specified process/ILD corners (sum of item 7 plus item 8 plus item 9).

In summary, as described above, all prior-art logic synthesis tools utilize total standard cell area as the metric to be minimized. Furthermore, these synthesis tools do a very efficient job of minimizing total standard cell area. Thus, in accordance with the present invention, these synthesis tools are utilized to minimize total standard cell power dissipation instead of total standard cell area. This is accomplished by computing an average power dissipation value (called a pseudo area) for each standard cell, causing the synthesis tools to respond as if they were minimizing total standard cell area. In reality, however, the tools are actually minimizing total standard cell power.

As described above, for non-memory standard cells the pseudo area depends upon: (1) the supply voltage value, (2) the average data frequency, and (3) the total gate oxide capacitance of all transistors inside the standard cell. Furthermore, for standard memory cells such as flipflops and latches, the pseudo area depends upon: (1) the supply voltage value, (2) the average clock frequency, (3) the average data frequency, (4) the total gate oxide capacitance of all transistors in the clock path, and (5) the total gate oxide capacitance of all transistors in the data path.

It should be understood that the above descriptions are examples of the present invention, and that various alternatives of the invention described herein may be employed in practicing the invention. Thus, it is intended that the following claims define the scope of the invention, and that structures and methods within the scope of these claims and their equivalents be covered thereby.

What is claimed is:

1. A method of synthesizing logic, the method comprising:
   identifying a plurality of groups of standard cell types that satisfy a plurality of logic requirements that define a logic block, the plurality of logic requirements being described by hardware description language code (HDL code); and
   generating a netlist by selecting standard cells from each group of standard cell types based upon one or more characteristics of the standard cell types, the type of standard cell selected from each group having a surface area characteristic that represents an amount of chip surface area that is consumed by the type of standard cell, a value associated with the surface area characteristic being defined by a pseudo-area value that represents an amount of power consumed by the type of standard cell selected from each group, the type of standard cell being selected to minimize power consumed by the logic block.

2. The method of claim 1 wherein the pseudo-area value is equal to $GOC*VCC^2*F_{AVG}$, where GOC is a gate oxide capacitance of all transistors in the type of standard cell, VCC is a cell power supply voltage, and $F_{AVG}$ is an average switching frequency of all of the standard cell types.

3. The method of claim 1 wherein the pseudo-area value is equal to $CPA_{CLK}+CPA_{DATA}$, where $CPA_{CLK}$ is a cell clock pseudo area and $CPA_{DATA}$ is a cell data pseudo area.

4. The method of claim 3 wherein $CPA_{CLK}$ is equal to $GOC_{CLK}*VCC^2*F_{CLK}$, where $GOC_{CLK}$ is the gate oxide capacitance of all transistors in a clock path, VCC is the cell power supply voltage, and $F_{CLK}$ is the average switching frequency of a clock path.

5. The method of claim 3 wherein $CPA_{DATA}$ is equal to $GOC_{DATA}*VCC*F_{DATA}$, where $GOC_{DATA}$ is the gate oxide capacitance of all transistors in a data path, VCC is the cell power supply voltage, and $F_{DATA}$ is the average switching frequency of the data path.

6. The method of claim 1 wherein the netlist includes a plurality of gates and flip-flops.

7. The method of claim 6 and further comprising determining an average total current and an average total power for all of the gates and flipflops in the synthesized netlist.

8. The method of claim 7 wherein the determination is made with a circuit simulation.

9. The method of claim 7 wherein the determination is made with calculations using values associated with the gates and flipflops in the netlist, and a number of global constants.

10. A method of synthesizing logic, the method comprising:
    determining a power consumption value for each of a number of standard cells so that each of the number of standard cells has a corresponding power consumption value, each standard cell having a stored surface area value that represents a required amount of chip surface area; and
    for each standard cell of the number of standard cells, replacing the stored surface area value with the corresponding power consumption value to form a pseudo surface area value.

11. The method of claim 10 and further comprising selecting a standard cell from a group of standard cells to be a selected standard cell, the pseudo surface area value of the selected standard cell being less than the pseudo surface area value of each standard cell in the group.

12. The method of claim 10 and further comprising selecting two or more standard cells from a number of groups of standard cells to form a list of standard cells, each standard cell on the list being selected from a group of standard cells of the number of groups of standard cells to be a selected standard cell, the pseudo surface area value of the selected standard cell being less than the pseudo surface area value of each standard cell in the group.

13. The method of claim 12 wherein the list of standard cells defines a synthesized logic block.

14. The method of claim 10 and further comprising determining a gate oxide capacitance for each of the number of standard cells.

15. The method of claim 14 wherein each standard cell includes a number of transistors.

16. The method of claim 15 and further comprising:

determining a gate oxide capacitance for each transistor in a standard cell; and summing together the gate oxide capacitance of each transistor in the standard cell to determine the gate oxide capacitance for the standard cell.

17. The method of claim 15 and further comprising:

determining a gate oxide capacitance for each transistor in a clock path of a standard cell;

summing together the gate oxide capacitance of each transistor in the clock path to determine a first gate oxide capacitance for the standard cell;

determining a gate oxide capacitance for each transistor in a data path of the standard cell;

summing together the gate oxide capacitance of each transistor in the data path to determine a second gate oxide capacitance for the standard cell; and summing together the first and second gate oxide capacitance to determine the gate oxide capacitance for the standard cell.

18. The method of claim 14 and further comprising extracting the gate oxide capacitance from a layout of a standard cell.

19. The method of claim 10 wherein the power consumption value of each standard cell is relative to the power consumption value of each other standard cell of the number of standard cells.

20. The method of claim 10 wherein the power consumption value of each standard cell is an absolute value.

* * * * *